United States Patent
Otto, IV et al.

(10) Patent No.: US 12,444,614 B2
(45) Date of Patent: Oct. 14, 2025

(54) ETCH SELECTIVITY MODULATION BY FLUOROCARBON TREATMENT

(71) Applicant: Tokyo Electron Limited, Tokyo (JP)

(72) Inventors: Ivo Otto, IV, Albany, NY (US);
Toshiki Kanaki, Albany, NY (US);
Jonathan Hollin, Nirasaki (JP);
Subhadeep Kal, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 140 days.

(21) Appl. No.: 18/453,843

(22) Filed: Aug. 22, 2023

(65) Prior Publication Data

US 2025/0069896 A1 Feb. 27, 2025

(51) Int. Cl.

| | |
|---|---|
| *H01L 21/311* | (2006.01) |
| *H10D 30/01* | (2025.01) |
| *H10D 30/67* | (2025.01) |
| *H10D 62/10* | (2025.01) |
| *H10D 64/01* | (2025.01) |
| *H10D 84/01* | (2025.01) |

(Continued)

(52) U.S. Cl.
CPC ...... *H01L 21/31116* (2013.01); *H10D 30/014* (2025.01); *H10D 30/6735* (2025.01); *H10D 62/121* (2025.01); *H10D 64/017* (2025.01); *H10D 84/0167* (2025.01); *H10D 84/038* (2025.01); *H10D 30/6757* (2025.01); *H10D 84/85* (2025.01)

(58) Field of Classification Search
None
See application file for complete search history.

(56) References Cited

U.S. PATENT DOCUMENTS

| | | | |
|---|---|---|---|
| 7,141,504 B1 * | 11/2006 | Bhardwaj | ............... C07C 17/00 438/719 |
| 9,607,855 B2 | 3/2017 | Takahashi et al. | |
| 9,997,598 B2 | 6/2018 | Smith et al. | |

(Continued)

FOREIGN PATENT DOCUMENTS

KR 102424642 B1 7/2022

OTHER PUBLICATIONS

Li et al., "A Novel Dry Selective Isotropic Atomic Layer Etching of SiGe for Manufacturing Vertical Nanowire Array with Diameter Less than 20 nm," Materials, vol. 13, Issue 3, Feb. 7, 2020, https://doi.org/10.3390/ma13030771, 11 pages.

(Continued)

*Primary Examiner* — Allan W. Olsen
(74) *Attorney, Agent, or Firm* — Slater Matsil, LLP

(57) ABSTRACT

A method of fabricating a field effect transistor (FET) over a substrate that includes: growing a doped p-type semiconductor from a silicon nanosheet of the substrate, the substrate including a layer stack of alternating layers of the silicon nanosheet and a sacrificial layer, and a dummy gate formed over the layer stack, the layer stack including a trench exposing sidewalls of the layer stack, the doped p-type semiconductor and the sacrificial layer being separated by a dielectric inner spacer; removing the dummy gate; and etching the sacrificial layer selectively to the doped p-type semiconductor, the etching including exposing the substrate to a process gas including a fluorocarbon and a fluorine-containing etch gas in the absence of plasma.

20 Claims, 8 Drawing Sheets

(51) Int. Cl.
    *H10D 84/03*     (2025.01)
    *H10D 84/85*     (2025.01)

(56) References Cited

U.S. PATENT DOCUMENTS

| | | | |
|---|---|---|---|
| 10,504,742 B2 * | 12/2019 | Zaitsu | H01L 21/02274 |
| 11,289,584 B2 | 3/2022 | Wu et al. | |
| 2015/0372118 A1 | 12/2015 | Zhang et al. | |
| 2016/0379835 A1 | 12/2016 | Kal et al. | |
| 2019/0214459 A1 * | 7/2019 | Cheng | H10D 30/024 |
| 2020/0098860 A1 | 3/2020 | Cheng et al. | |
| 2021/0098485 A1 * | 4/2021 | Bin | H10B 43/20 |
| 2022/0149176 A1 * | 5/2022 | More | H10D 30/031 |
| 2022/0384199 A1 * | 12/2022 | Han | H01L 21/3065 |
| 2022/0406572 A1 | 12/2022 | Oyama et al. | |
| 2023/0044406 A1 * | 2/2023 | Sinha | H01L 21/32137 |
| 2023/0154923 A1 * | 5/2023 | Lin | H10D 84/0184 |
| | | | 257/351 |
| 2023/0197818 A1 | 6/2023 | Kumar et al. | |
| 2023/0207382 A1 | 6/2023 | Bertrand et al. | |
| 2024/0074141 A1 * | 2/2024 | Nakamura | H10B 12/03 |
| 2025/0112051 A1 * | 4/2025 | Huang | H01L 21/3065 |

OTHER PUBLICATIONS

Mertens et al., "Si-cap-free SiGe p-Channel FinFETs and Gate-All-Around Transistors in a Replacement Metal Gate Process: Interface Trap Density Reduction and Performance Improvement by High-Pressure Deuterium Anneal," 2015 Symposium on VLSI Technology Digest of Technical Papers, Jun. 16, 2015, 2 pages.

Mukesh et al., "A Review of the Gate-All-Around Nanosheet FET Process Opportunities," Electronics 2022, vol. 11, No. 21, https://doi.org/10.3390/electronics11213589, Nov. 3, 2022, 11 pages.

International Search Report and Written Opinion, PCT/US2024/034544, Mailed Oct. 4, 2024, Total pp. 8.

* cited by examiner

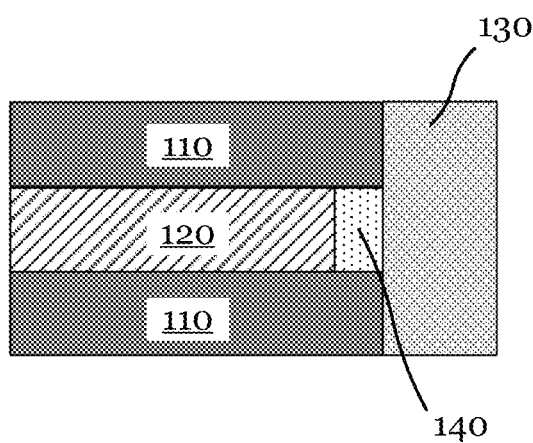
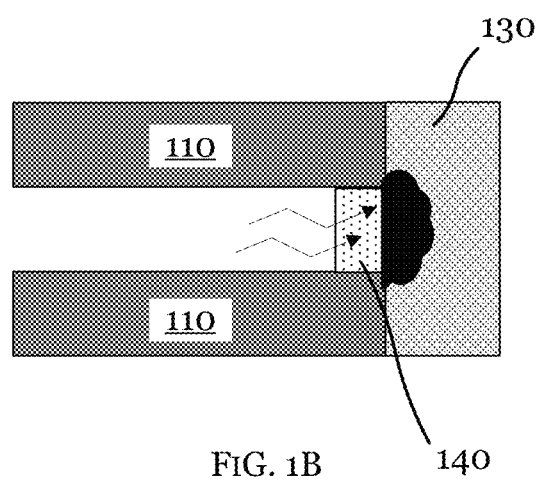
FIG. 1A
(PRIOR ART)
FIG. 1B
(PRIOR ART)

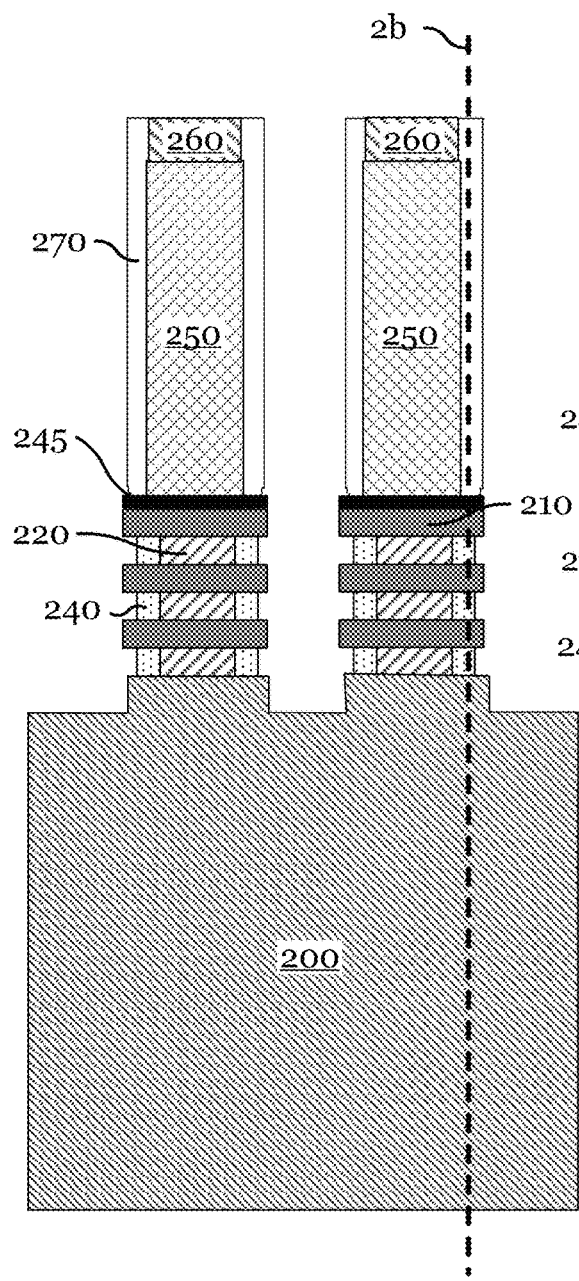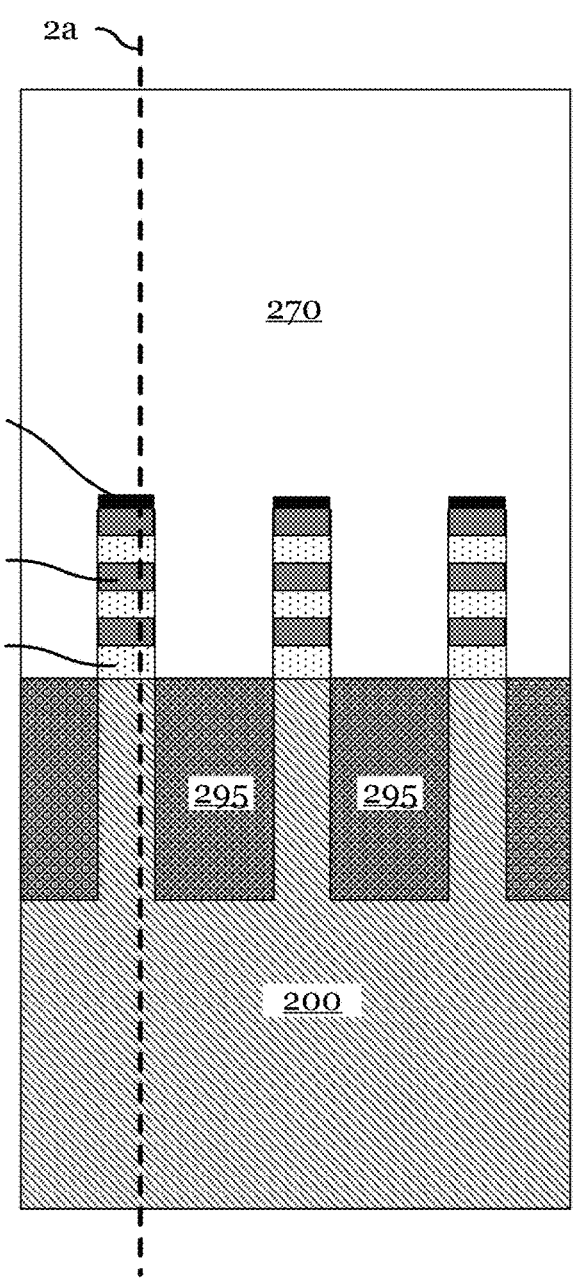
FIG. 2A
FIG. 2B

ETCH SELECTIVITY MODULATION BY FLUOROCARBON TREATMENT

TECHNICAL FIELD

The present invention relates generally to methods of processing a substrate, and, in particular embodiments, to etch selectivity modulation by fluorocarbon treatment.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Many of the processing steps used to form the constituent structures of semiconductor devices is performed using various deposition and etch techniques such as plasma processes.

The semiconductor industry has repeatedly reduced the minimum feature sizes in semiconductor devices to a few nanometers to increase the packing density of components. Accordingly, the semiconductor industry increasingly demands processing technology to provide processes for patterning features with accuracy, precision, and profile control, often at atomic scale dimensions. These requirements are particularly stringent for three-dimensional (3D) structures, for example, a fin field-effect transistor (FinFET), a gate-all-around FET (GAAFET), and a stacked FET. Meeting this challenge along with the uniformity and repeatability needed for high volume IC manufacturing requires further innovations of materials processing technology.

SUMMARY

In accordance with an embodiment of the present invention, a method of fabricating a field effect transistor (FET) over a substrate that includes: growing a doped p-type semiconductor from a silicon nanosheet of the substrate, the substrate including a layer stack of alternating layers of the silicon nanosheet and a sacrificial layer, and a dummy gate formed over the layer stack, the layer stack including a trench exposing sidewalls of the layer stack, the doped p-type semiconductor and the sacrificial layer being separated by a dielectric inner spacer; removing the dummy gate; and etching the sacrificial layer selectively to the doped p-type semiconductor, the etching including exposing the substrate to a process gas including a fluorocarbon and a fluorine-containing etch gas in the absence of plasma.

In accordance with an embodiment of the present invention, a method of fabricating a field effect transistor (FET) over a substrate that includes: growing a doped p-type semiconductor from a silicon nanosheet of the substrate, the substrate including a layer stack of alternating layers of the silicon nanosheet and a sacrificial layer, and a dummy gate formed over the layer stack, the layer stack including a trench exposing sidewalls of the layer stack, the doped p-type semiconductor and the sacrificial layer being separated by an inner spacer, the sacrificial layer including a surface oxide; removing the dummy gate; removing the surface oxide; exposing the substrate to a pretreatment gas including a fluorocarbon in the absence of plasma to passivate the doped p-type semiconductor, a portion of the pretreatment gas penetrating the inner spacer; and exposing the substrate to an etch gas including fluorine in the absence of plasma to etch the sacrificial layer selectively to the doped p-type semiconductor.

In accordance with an embodiment of the present invention, a method of processing a substrate, the method including: etching un-doped silicon-germanium (SiGe) of the substrate selectively to doped SiGe of the substrate in the absence of plasma, the etching including, exposing the substrate to a pretreatment gas including $C_2F_6$ or $C_4F_8$, and exposing the substrate to an etch gas including HF and $F_2$.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1B illustrate cross sectional views of an example substrate for a p-channel field effect transistor (pFET) with source and drain damage caused by a conventional channel release process, wherein FIG. 1A illustrates the substrate prior to the conventional channel release process, and FIG. 1B illustrates the substrate after the conventional channel release process;

FIGS. 2A-2F illustrate cross sectional views of an example substrate during an example process of pFET fabrication comprising a plasma-less etch process at various stages in accordance with various embodiments, wherein FIG. 2A illustrates an incoming substrate comprising two dummy gate structures with underlying stacks of nanosheets and sacrificial layers, FIG. 2B illustrates another cross sectional view perpendicular to FIG. 2A, FIG. 2C illustrates the substrate after source and drain (S/D) formation, FIG. 2D illustrates the substrate after dummy gate removal, FIG. 2E illustrates the substrate after the plasma-less etch process for channel release, and FIG. 2F illustrates the substrate after high-k metal gate (HKMG) formation;

FIGS. 3A-3B illustrate cross sectional views of another example substrate during an example process of fabrication for a complementary FET (CFET) with a stack structure of n-channel FET (nFET) and pFET in accordance with alternate embodiments, wherein FIG. 3A illustrates an incoming substrate with the stack structure with two types of FETs, and FIG. 3B illustrates the substrate after a plasma-less etch process for channel release;

FIGS. 5A-5C illustrate process flow charts of methods of plasma-less etch in accordance with various embodiments, wherein FIG. 5A illustrates an embodiment process flow, FIG. 5B illustrates an alternate embodiment process flow, and FIG. 5C illustrate another alternate embodiment process flow.

DETAILED DESCRIPTION OF ILLUSTRATIVE EMBODIMENTS

Figure 2C:
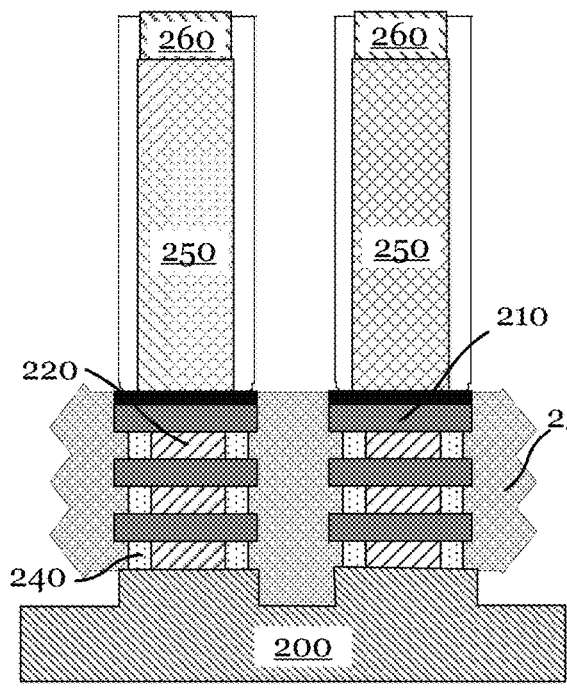

This application relates to methods of processing a substrate, more particularly to etch selectivity modulation by fluorocarbon treatment. Generally, fabricating complicated structures for advanced semiconductor devices, for example 3-D devices such as gate-all-around field effect transistors (GAAFETs) and stacked FETs, may require laterally removing materials to selectively expose a portion of the underlying structure. However, it may be challenging to achieve sufficient etch selectivity in certain processes due to the small scale and design complexity of the features to be fabricated.

One example of such difficult etch processes is a channel release process for a nanosheet/nanowire p-channel FET (pFET), where the insufficient etch selectivity may cause a severe damage to source/drain (S/D) regions. Commonly, as illustrated in FIG. 1A, a layer stack of silicon (Si) nanosheets 110 and sacrificial layers 120 may be formed to provide multiple Si nanosheet/nanowire channels, and S/D materials 130 may be epitaxially grown from the tip of the Si nanosheet/nanowire. Typically, the S/D materials 130 may comprise boron-doped silicon germanium (B-doped SiGe) and the sacrificial layers 120 may comprise un-doped SiGe. During the channel release process, the sacrificial layers 120 need to be removed by dry etching. An inner spacer 140 may be used to separate the sacrificial layers 120 from the S/D materials 130 in order to protect the S/D materials 130 during the channel release process. However, as illustrated in FIG. 1B with arrows, the etch gas used in the conventional channel release process may penetrate the inner spacer 140 and reach and damage the S/D materials 130. Although the inner spacer 140 may be chemically resistant to the etch gas and able to provide etch selectivity in principle, the penetration of the etch gas may be inevitable because the inner spacer 140 is typically scaled to a small thickness and made porous to reduce its dielectric constant in order to minimize the parasitic capacitance caused by the inner spacer 140. Therefore, a new method of etching that enables etch selectivity between an un-doped semiconductor (e.g., SiGe) and a doped semiconductor (e.g., B-doped SiGe) may be desired.

This disclosure proposes a method of plasma-less etch enhanced with fluorocarbon pretreatment to enable such etch selectivity. In various embodiments, un-doped SiGe may be etched selectively to B-doped SiGe in the absence of plasma. The inventors of this applications demonstrated that the etch selectivity may be enabled by the treatment with a fluorocarbon (e.g., $C_2F_6$, $C_4F_8$, or $C_xF_y$). The plasma-less etch of the un-doped semiconductor may be performed using a fluorine-containing etch gas such as HF, $F_2$, $ClF_3$, or a mixture thereof. The fluorocarbon treatment may be performed as a pretreatment prior to the etch step, or alternately it may be integrated as a single etch process step. The methods of plasma-less etch can be applied, for example, as a channel release process in pFET fabrication and may advantageously mitigate the issue of source/drain (S/D) damage despite the penetration through the inner spacer, thereby improving the device yield. The etch process may be a part of a fabrication process for gate-all-around field effect transistors (GAAFETs) or emerging stacked FETs such as complementary FET (CFET).

In the following, the steps of pFET fabrication comprising a plasma-less etch with fluorocarbon treatment are described referring to FIGS. 2A-2F in accordance with various embodiments. As an example, the pFET fabrication for a nanosheet/nanowire gate-all-around FET (GAAFET) device is illustrated in FIGS. 2A-2F. Another example is also described referring to FIGS. 3A-3B in accordance with another embodiment for a stacked FET structure. Exemplary etch rates for un-doped SiGe and B-doped SiGe during the plasma-less etch in accordance with one embodiment are plotted in FIG. 4. Example process flow diagrams are illustrated in FIG. 5A-5C. All figures in this disclosure are drawn for illustration purpose only and not to scale, including the aspect ratios of features. Although this disclosure primarily describes embodiments for a channel release process to remove SiGe selectively to the source/drain (S/D) region of B-doped SiGe in GAAFET and stacked FET applications, the methods of plasma-less etch with fluorocarbon treatment may also be applied in various other application where the fluorocarbon treatment may induce etch selectivity between an un-doped semiconductor and a doped semiconductor.

FIGS. 2A-2F illustrate cross sectional views of an example substrate during an example process of pFET fabrication comprising a plasma-less etch process at various stages in accordance with various embodiments.

FIG. 2A illustrates a cross sectional view of an incoming substrate 200 comprising two dummy gate structures with underlying stacks of nanosheets and sacrificial layers, and FIG. 2B illustrates another cross sectional view perpendicular to FIG. 2A.

In FIG. 2A, the semiconductor structure may have undergone a number of steps of processing following, for example, a conventional process. For example, the semiconductor structure may comprise a substrate 200 in which various device regions are formed. At this stage, the substrate 200 may include isolation regions such as shallow trench isolation (STI) regions as well as other regions formed therein.

The substrate 200 may comprise a semiconductor substrate in various embodiments. In one or more embodiments, the substrate 200 may be a silicon wafer, or a silicon-on-insulator (SOI) wafer. In certain embodiments, the substrate 200 may comprise a germanium wafer, silicon germanium wafer, silicon carbide wafer, gallium arsenide wafer, gallium nitride wafer and other compound semiconductors. In other embodiments, the substrate 200 comprises heterogeneous layers such as silicon germanium on silicon, gallium nitride on silicon, silicon carbon on silicon, as well layers of silicon on a silicon or SOI substrate.

In various embodiments, the substrate 200 in FIGS. 2A-2B may be at an intermediate stage of fabricating a pFET device. For example, fabrication processes that may have been already performed include but are not limited to a nanosheet layer stack formation, dummy gate formation, one or more spacer formation, source/drain fin etch back, lateral recess etch, inner spacer formation, and another etch back.

As further illustrated in FIG. 2A, the substrate 200 may comprise a plurality of nanosheet layers or nanosheets 210 formed therein. Specifically, the nanosheets 210 are embedded in a different material. The nanosheets 210 may be spaced apart from each other by one of a plurality of sacrificial layers or sacrificial layers 220. Thus, the substrate 200 comprises alternating layers of the sacrificial layers 220 and the nanosheets 210. It should be noted that while three layers of the nanosheets 210 are depicted in FIG. 2A, the number of layers is not limited. In various embodiments, the nanosheets 210, at the end of fabrication, may form the transistor channels, while the sacrificial layers 220 will be removed in a later step of fabrication (e.g., channel release in FIG. 2E) to free up a void space for the formation of gate dielectric (e.g., high-k dielectric materials) and gate terminal. As previously described, removing the sacrificial layers 220 with conventional methods may result in damage to source/drain (S/D) regions, which may advantageously be overcome by various embodiments of the plasma-less etch process.

In various embodiments, the nanosheets 210 have thickness of a few nanometer to tens of nanometer, for example, about 1 nm to about 20 nm in one embodiment. In another embodiment, the nanosheets 210 have thickness of about 1 nm to about 10 nm in one embodiment.

In various embodiments, the sacrificial layers 220 comprise silicon germanium (SiGe) and the nanosheets 210 comprise silicon (Si). In certain embodiments, a stack of the nanosheets 210 and the sacrificial layer 220 may be formed by deposition processes, for example, epitaxially by a chemical vapor deposition (CVD) method. In one or more embodiments, the SiGe for the sacrificial layer 220 may have a Ge concentration between 5% and 30%. In various embodiments, each layer of the sacrificial layers 220 and the nanosheets 210 may be few to several nanometers in thickness. In one embodiment, each layer of the sacrificial layers 220 may have a thickness between 5 nm and 20 nm and each layer of the nanosheets 210 may have a thickness between 1 nm and 10 nm.

As further illustrated in FIG. 2A, the substrate 200 may comprise a dielectric blocking layer 245 over the alternating layer stack of the nanosheets 210 and the sacrificial layer 220. The dielectric blocking layer 245 may be an oxide layer in one embodiment. The dielectric blocking layer 245 may be formed by deposition processes, for example, by a CVD method. The dielectric blocking layer 245 may be used as an etch stop layer and may be optional.

The substrate 200 may further comprise a dummy gate 250 over the stack of the nanosheets 210 and the sacrificial layer 220. In FIG. 2A, a feature of two fins for the dummy gate 250 is illustrated as example. The dummy gate 250 may comprise polysilicon or amorphous silicon as example. A layer to form the dummy gate 250 may be deposited using deposition techniques such as vapor deposition including chemical vapor deposition (CVD), physical vapor deposition (PVD), as well as other plasma processes such as plasma enhanced CVD (PECVD), sputtering, and other processes. The layer may then be patterned to form the dummy gate 250 using a photolithographic and etching process. The dummy gate 250 may have a thickness of about 50 nm to about 500 nm in various embodiments.

Still referring to FIG. 2A, a hard mask 260 used for patterning the dummy gate 250 may be present. The hard mask 260 may comprise silicon oxide in one embodiment. In various embodiments, the hard mask 260 may comprise silicon nitride, silicon carbonitride (SiCN), or silicon oxycarbide (SiOC). In alternate embodiments, the hard mask 260 may comprise titanium nitride. Further, although not specifically illustrated, the hard mask 260 may be a stacked hard mask comprising, for example, two or more layers using two different materials. The first hard mask of the hard mask 260 may comprise a metal-based layer such as titanium nitride, titanium, tantalum nitride, tantalum, tungsten based compounds, ruthenium based compounds, or aluminum based compounds, and the second hard mask material of the hard mask 260 may comprise a dielectric layer such as $SiO_2$, silicon nitride, SiCN, SiOC, silicon oxynitride, silicon carbide, amorphous silicon, or polycrystalline silicon. The hard mask 260 may be deposited using deposition techniques such as vapor deposition including chemical vapor deposition (CVD), physical vapor deposition (PVD), as well as other plasma processes such as plasma enhanced CVD (PECVD), sputtering, and other processes. The hard mask 260 may have a thickness of about 5 nm to about 50 nm in various embodiments.

Further in FIG. 2A, an outer spacer 270 may be formed to cover the sidewalls of the dummy gate 250. In various embodiments, the outer spacer 270 may comprise a dielectric material comprising an oxide or a nitride. In certain embodiments, the outer spacer 270 may comprise silicon-containing dielectric materials such as silicon oxide, silicon oxynitride (SiON), silicon oxycarbonitride (SiOCN) and silicon boron carbonitride (SiBCN). The outer spacer 270 may be deposited over the dummy gate 250 prior to the fin etch back, using deposition techniques such as vapor deposition including chemical vapor deposition (CVD), physical vapor deposition (PVD), as well as other plasma processes such as plasma enhanced CVD (PECVD), atomic layer deposition (ALD), sputtering, and other processes. The outer spacer 270 may have a thickness of about 1 nm to about 10 nm in various embodiments. In certain embodiments, the outer spacer 270 may be a stacked layer comprising, for example, two or more layers using two different materials.

In one or more embodiments, a fin height may be between 200 nm and 250 nm and the distance between the two fins may be between 6 nm and 12 nm. This high aspect ratio makes it challenging to etch target materials sufficiently from the trench while preventing any damage to other materials.

In various embodiments, an inner spacer 240 is formed to cap the indented sidewalls of the sacrificial layers 220. The inner spacer 240 ensures the electrical insulation between the gate region and source/drain (S/D) region that will be formed at later steps in fabrication. The inner spacer 240 may be formed by first laterally etching the sacrificial layers 220 selectively to the nanosheets 210, depositing a layer of an inner spacer material, and etching back to expose only the tip of the nanosheets 210 while the remaining portion of the inner spacer material covers the sacrificial layers 220 between the tips as illustrated in FIG. 2A.

In certain embodiments, the inner spacer 240 may comprise a silicon-containing dielectric material such as silicon nitride, silicon carbonitride (SiCN), silicon oxycarbonitride (SiOCN) and silicon boron carbonitride (SiBCN). In one embodiment, the inner spacer 240 may comprise a low-k dielectric material. The deposition of the inner spacer material may be performed by deposition from a gas phase, for example, using chemical vapor deposition (CVD), plasma-enhanced CVD (PECVD), low-pressure CVD (LPCVD) physical vapor deposition (PVD), atomic layer deposition (ALD), and/or other deposition processes. For a plasma deposition process, a precursor gas mixture can be used including but not limited to silanes, hydrocarbons, fluorocarbons, or nitrogen containing compounds in combination with one or more dilution gases (e.g., argon, nitrogen, etc.) at a variety of pressure, power, flow and temperature conditions.

In various embodiments, the materials for the inner spacer 270 may be selected to provide etch selectivity to the S/D materials to be formed in a subsequent step (e.g., FIG. 2C). On the other hand, in order to minimize the parasitic capacitance, the inner spacer 240 may be made to be thin and porous. In one embodiment, the inner spacer 240 may have a thickness between 3 nm and 10 nm.

In FIG. 2B, the cross sectional view along with a cross section indicated by a dotted line 2b in FIG. 2A. Conversely, FIG. 2A illustrates the cross sectional view along with a cross section 2a in FIG. 2B. In FIG. 2B, isolation regions such as shallow trench isolation (STI) regions 295 are visible, which is not visible in FIG. 2A and following FIGS. 2C-2F sharing the same cross section with FIG. 2A. The STI regions 295 serve to electrically isolate adjacent electronic components.

Further in FIG. 2B, while the tips of the nanosheets 210, the dielectric blocking layer 245, and the inner spacer 240 are exposed and visible in the source/drain (S/D) regions, the sacrificial layers 220 are masked by the inner spacer 240 and not visible. The dummy gate 250 is also visible only in FIG. 2A, being masked by the outer spacer 270.

FIG. 2C illustrates a cross sectional view of the substrate 200 after source and drain (S/D) formation.

In various embodiments, a source/drain (S/D) region may be formed with a S/D material 230. The S/D material 230 fills the lateral recess and a portion of the fin feature over the exposed tips of the nanosheets 210. The formation of the S/D region may be performed, for example, by epitaxial growth. In certain embodiments, the S/D region formed with an epitaxial growth process may comprise a faceted outer surface. In various embodiments, the substrate 200 may be used to fabricate a pFET, and accordingly the S/D material 230 may comprise a p-type semiconductor, for example, boron-doped silicon germanium (B-doped SiGe). In certain embodiments, the dopant concentration in the S/D material 230 may be $1-5 \times 10^{20}/cm^3$. In one or more embodiments, the B-doped SiGe for the S/D material 230 may have a Ge concentration between 30% and 70%. In various embodiments, the Ge concentration in the S/D material 230 may be higher than that in the sacrificial layer 220.

In certain embodiments, although not specifically illustrated, the substrate 200 may further comprise one or more nFET structures adjacent to the pFET structures illustrated in FIGS. 2A-2F. For the nFET structures, the substrate 200 may comprise a similar fin and dummy gate structure where a n-semiconductor (e.g., phosphorous-doped silicon) may be epitaxially grown from the tips of the nanosheets.

Figure 2D:
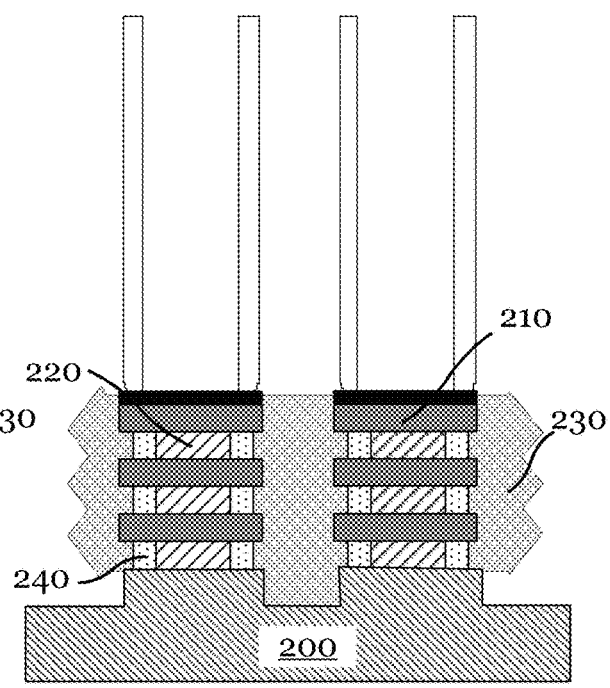

FIG. 2D illustrates a cross sectional view of the substrate 200 after dummy gate removal.

After the S/D formation, the dummy gate 250 along with any remaining portion of the hard mask 260 may be removed. In certain embodiments, the dummy gate pull may be performed using a plasma etch process such as reactive ion etch (RIE) process, or other etch processes.

In certain embodiments, after the dummy gate pull (FIG. 2D) and prior to a subsequent step of plasma-less etch process (FIG. 2E), an oxide removal process may optionally be performed to remove a surface oxide layer that may be present over the sacrificial layers 220. For example, the oxide removal process may be a plasma-less process comprising exposing the substrate 200 to a process gas comprising HF in the absence of plasma. In one embodiment, the process gas may comprise 30% HF and 30% $NH_3$ in a carrier gas (e.g., Ar) and the process temperature may be between 35° C. and 80° C. The oxide removal process may be followed by a thermal treatment comprising heating the substrate 200 to a temperature between 100° C. and 200° C. under an inert gas flow.

Figure 2E:
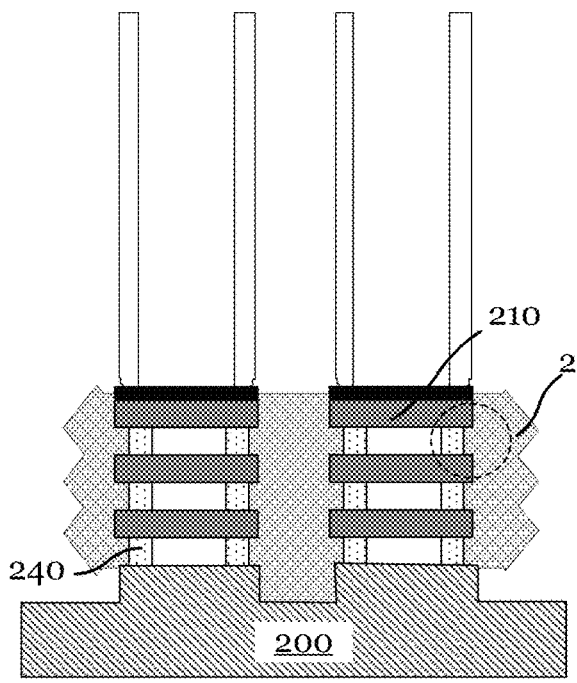

FIG. 2E illustrates a cross sectional view of the substrate 200 after the plasma-less etch process for channel release.

In various embodiments, the plasma-less etch process for channel release may be a two-step process: a fluorocarbon pretreatment step and an etch step. Both steps may advantageously performed in the absence of plasma. The fluorocarbon pretreatment may comprise exposing the substrate 200 to a pretreatment gas comprising a fluorocarbon to passivate the S/D material 230 (e.g., B-doped SiGe), and the etch step may comprise exposing the substrate 200 to an etch gas comprising fluorine to etch the sacrificial layers 220 selectively, without causing damage to the S/D material 230.

In certain embodiments, the fluorocarbon for the pretreatment gas may comprise $C_2F_6$, $C_4F_8$, or a compound with a general chemical formula $C_xF_y$. In another embodiment, the fluorocarbon may further comprise hydrogen (i.e., hydro-fluorocarbon with a general chemical formula $C_xH_yF_z$). In one or more embodiments, the process conditions for the fluorocarbon pretreatment step may be as follows: chamber pressure: 750-2000 mT; substrate temperature: 0-50° C.; and process gas: 5-25% $C_xF_y$ in Ar. In one embodiment, the process time may be between 30 sec and 10 min. Although not wishing to be limited by any theory, a portion of the pretreatment gas is expected to penetrate the inner spacer 240 and passivate the interface between the inner spacer and the S/D material 230, preventing from being etched during the etch step. Further, in some instances, there may be some defects in the inner spacer 240 due to prior process steps (e.g., reactive ion etch), and thereby the pretreatment gas may be able to reach an exposed portion of the S/D material 230 without the penetration through the inner spacer 240.

For the etch step, the etch gas may comprise HF, $F_2$, $ClF_3$, or a combination thereof. In one or more embodiments, the process conditions for the etch step may be as follows: chamber pressure: 50-800 mT; substrate temperature: 35-80° C.; and process gas: 40% HF/30% $F_2$/5% $ClF_3$ in Ar. In one embodiment, the process time may be between 10 sec and 120 sec. In one embodiment, the etch step may be performed without exposing the substrate 200 to the fluorocarbon of the pretreatment gas or any other fluorocarbon. In another embodiment, the etch gas may further comprise a fluorocarbon.

In various embodiments, after the etch step, a post-etch thermal treatment may be performed by heating the substrate 200 to a temperature between 100° C. and 200° C. under an inert gas flow.

In other embodiments, the fluorocarbon treatment may be integrated into the etch step and the plasma-less etch process may be performed as a single continuous process. In these embodiments, the process gas for the plasma-less etch process may comprise both a fluorocarbon (e.g., $C_xF_y$) and a fluorine-containing etch gas (e.g., HF, $F_2$, and $ClF_3$). In one or more embodiments, the process conditions may be as follows: chamber pressure: 250-800 mT; substrate temperature: 35-50° C.; and process gas: 25% $C_xF_y$, 40% HF, 30% $F_2$, and 5% $ClF_3$. In one embodiment, the process time may be between 30 sec and 10 min. With combining the two steps of the prior embodiments, the single continuous process may advantageously have a shorter total process time to achieve the same etch performance. On the other hand, the two-step embodiments may be more flexible in fine tuning process conditions and ensure the passivation of the surface to be protected.

Further, in alternate embodiments, during the single continuous plasma-less etch process, the fluorocarbon for passivation may also be intermittently flowed rather than at a constant flow. For example, a gas pulsing scheme may be applied. In one embodiment, the etch step may be started and proceeded at an initial stage of removing the sacrificial layers 220, and the fluorocarbon may be flowed as an additional process gas component when the etch is approaching the process end with the inner spacer 240 becoming exposed.

As indicated by a dotted circle in FIG. 2E, the sacrificial layers 220 (e.g., un-doped SiGe) may be removed by the plasma-less etch process without causing any damage to the S/D material 230 (e.g., B-doped SiGe), overcoming the issue described above referring to FIG. 1B.

Figure 2F:
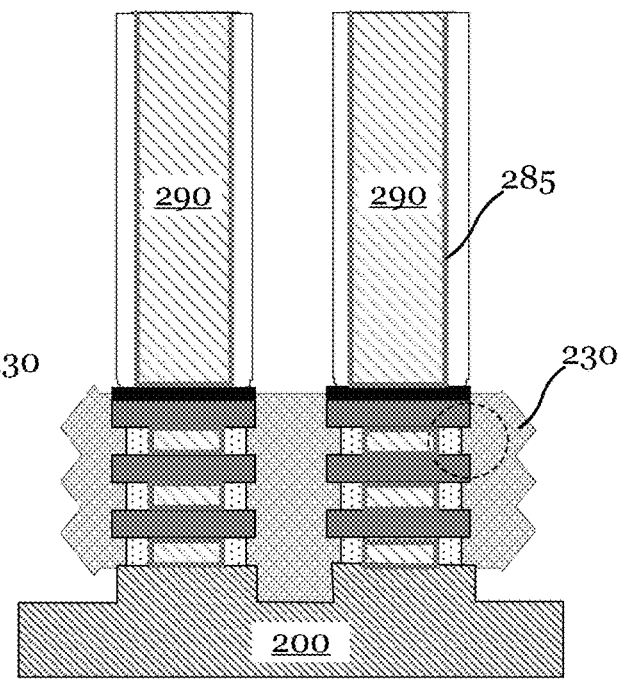

FIG. 2F illustrates a cross sectional view of the substrate 200 after high-k metal gate (HKMG) formation.

The channel release by the plasma-less etch process (FIG. 2E) can free up the space that was occupied by the sacrificial layers 220, and this created void space may be filled with gate dielectric (e.g., high-k dielectric materials) and gate terminal through the HKMG formation. First, a high-k dielectric (HK) layer 285 may be deposited. In various embodiments, the HK layer 285 comprises $HfO_2$ or $Hf_xSi_yO_zN_w$. The HK layer 285 may be deposited using appropriate deposition techniques such as vapor deposition including atomic layer deposition (ALD), chemical vapor deposition (CVD), physical vapor deposition (PVD), as well as other plasma processes such as plasma enhanced CVD (PECVD), sputtering, and other processes. In certain embodiments, an optional insulating layer, such as a silicon oxide layer, may be formed beneath the HK layer 285.

Over the HK layer 285, a replacement metal gate (RMG) material 290 may be deposited to fill the remainder of the void space to complete the HKMG formation. In various embodiments, the RMG material 290 may comprise a combination of several layers, including a workfunction metal and a metallic fill. The workfunction metal of the RMG material may comprise titanium nitride, tantalum nitride, or metal alloys such as AlC, TiAl and TiAlC. Metal deposition is continued till the remaining recesses are filled with excess metallic fill material. In some embodiments, the metallic fill material may comprise a low resistivity metal, for example, tungsten (W), copper (Cu), cobalt (Co), or aluminum (Al). In some embodiments, the RMG material 290 may be deposited using a highly conformal process such as an atomic layer deposition (ALD) process. After the deposition steps, any excess metal may be removed by a planarizing process such as chemical mechanical planarization (CMP). Subsequently, middle-of-line (MOL)/back-end-of-line (BEOL) processes may be performed.

Figure 3A:
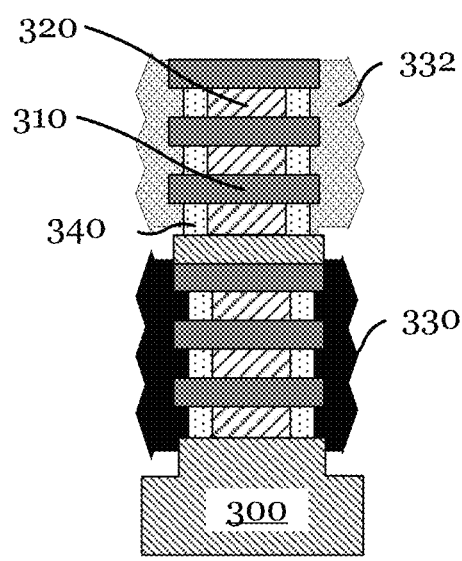
Figure 3B:
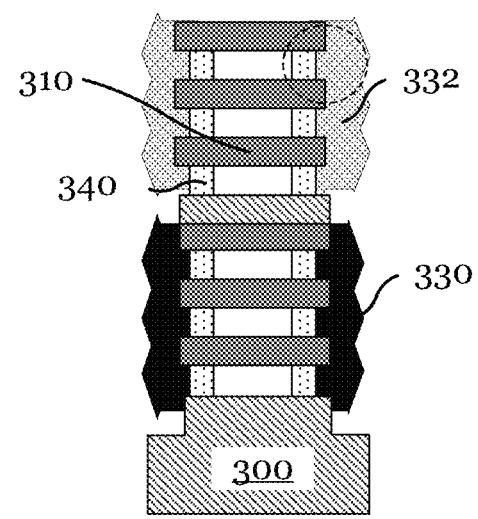

FIGS. 3A-3B illustrate cross sectional views of another example substrate during an example process of fabrication for a complementary FET (CFET) with a stack structure of n-channel FET (nFET) and pFET in accordance with alternate embodiments. FIG. 3A illustrates a cross sectional view of an incoming substrate 300 with the stack structure with two types of FETs. Some details of the layer stack structure over the substrate 300 may be identical to those described above referring to FIGS. 2A-2F, and thus they will not be repeated.

In various embodiments, for the CFET design, one FET structure (e.g., pFET) may be stacked on top of another FET structure (e.g., nFET). Similar to the substrate 200 in FIG. 2A, the substrate 300 may have already undergone a nanosheet layer stack formation (e.g., nanosheets 310 and sacrificial layers 320), dummy gate formation, one or more spacer formation, source/drain (S/D) fin etch back, lateral recess etch, inner spacer formation (e.g., an inner spacer 340), another etch back, and S/D formation. In various embodiments, the nanosheets 310 may comprise silicon (Si), the sacrificial layers 320 may comprise un-doped silicon germanium (un-doped SiGe), and the inner spacer 340 may comprise a silicon-containing dielectric material.

In FIG. 3A, the S/D formation may be performed to epitaxially grow a first S/D material 330 and a second S/D material 332 form the tips of the nanosheets 310. In certain embodiments, the first S/D material 330 may comprise a phosphorous-doped silicon (P-doped Si) for the nFET device and the second S/D material 332 may comprise boron-doped silicon germanium (B-doped SiGe) for the pFET device. The channel release may be then performed (FIG. 3B) to remove the sacrificial layers 320 to free up a void space for both FET device structures.

FIG. 3B illustrates a cross sectional view of the substrate 300 after a plasma-less etch process for channel release.

The methods of plasma-less etch process of this disclosure may be applied in CFET fabrication as a channel release process as illustrated in FIG. 3B. The process details in various embodiments have been described in prior embodiments referring to FIGS. 2D-2E, and thus will not be repeated. As indicated by a dotted circle in FIG. 3B for the pFET device structure, the sacrificial layers 320 (e.g., un-doped SiGe) may be removed by the plasma-less etch process without causing any damage to the second S/D material 332 (e.g., B-doped SiGe). It should be noted that since the first S/D material 330 (e.g., P-doped Si) may have distinctly different materials properties, and thus damage to the first S/D material 330 does not typically occur thanks to the inherent etch selectivity of the plasma-less etch process.

As described above referring to FIGS. 2A-2F and 3A-3B, the plasma-less etch process can be used to remove SiGe selectively in GAAFET and stacked FET applications. In various embodiments, the methods may overcome the penetration issue where the etch gas penetrate the inner spacer and damage the source/drain (S/D) region of B-doped SiGe. The methods, however, does not require an inner spacer blocking the B-doped SiGe or the dopant to be specifically boron, and may be applied in other applications. For example, the methods can be applied even the surface of B-doped SiGe is exposed and not covered by the inner spacer or any layer. Further, the plasma-less fluorocarbon treatment may also be applied to induce etch selectivity generally between an un-doped semiconductor and a doped semiconductor.

Figure 4:
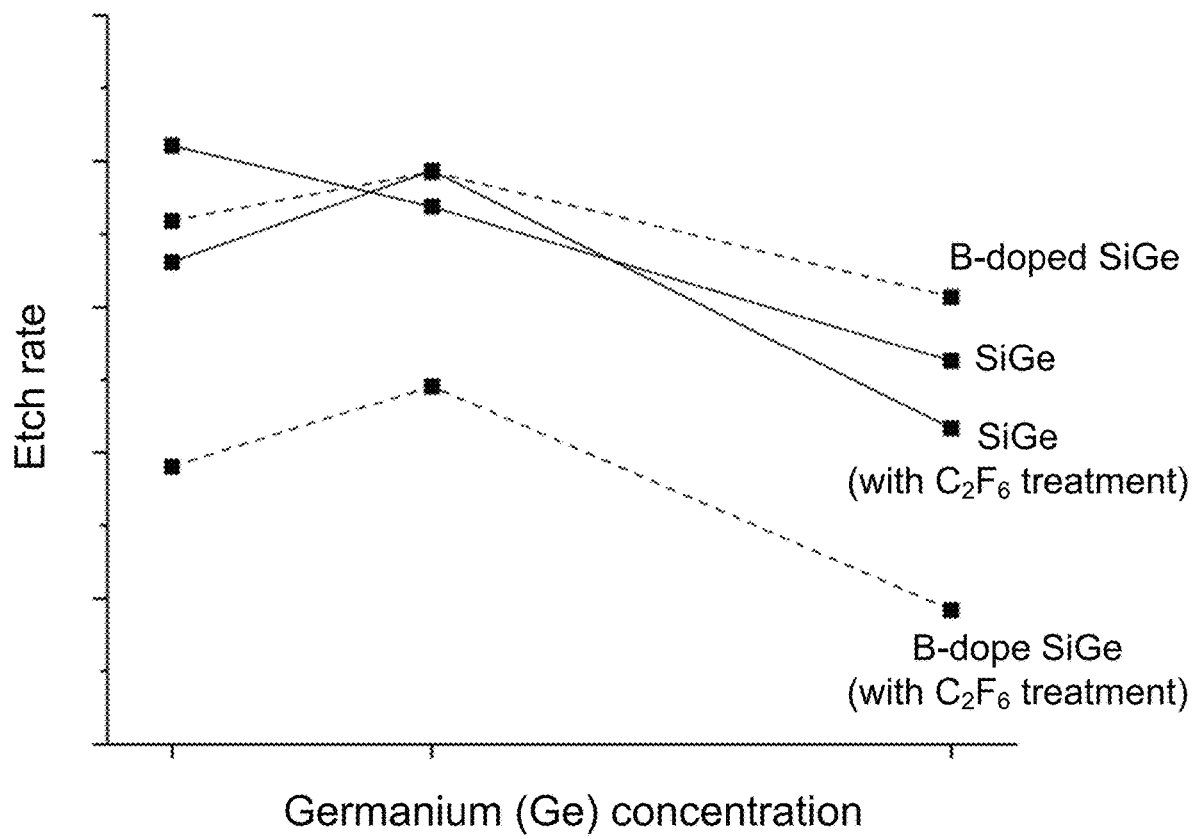
FIG. 4 illustrates the effect of a fluorocarbon pretreatment on the etch rate of un-doped silicon germanium (SiGe) and boron-doped SiGe during the plasma-less etch in accordance with one embodiment.
Figure 5A:
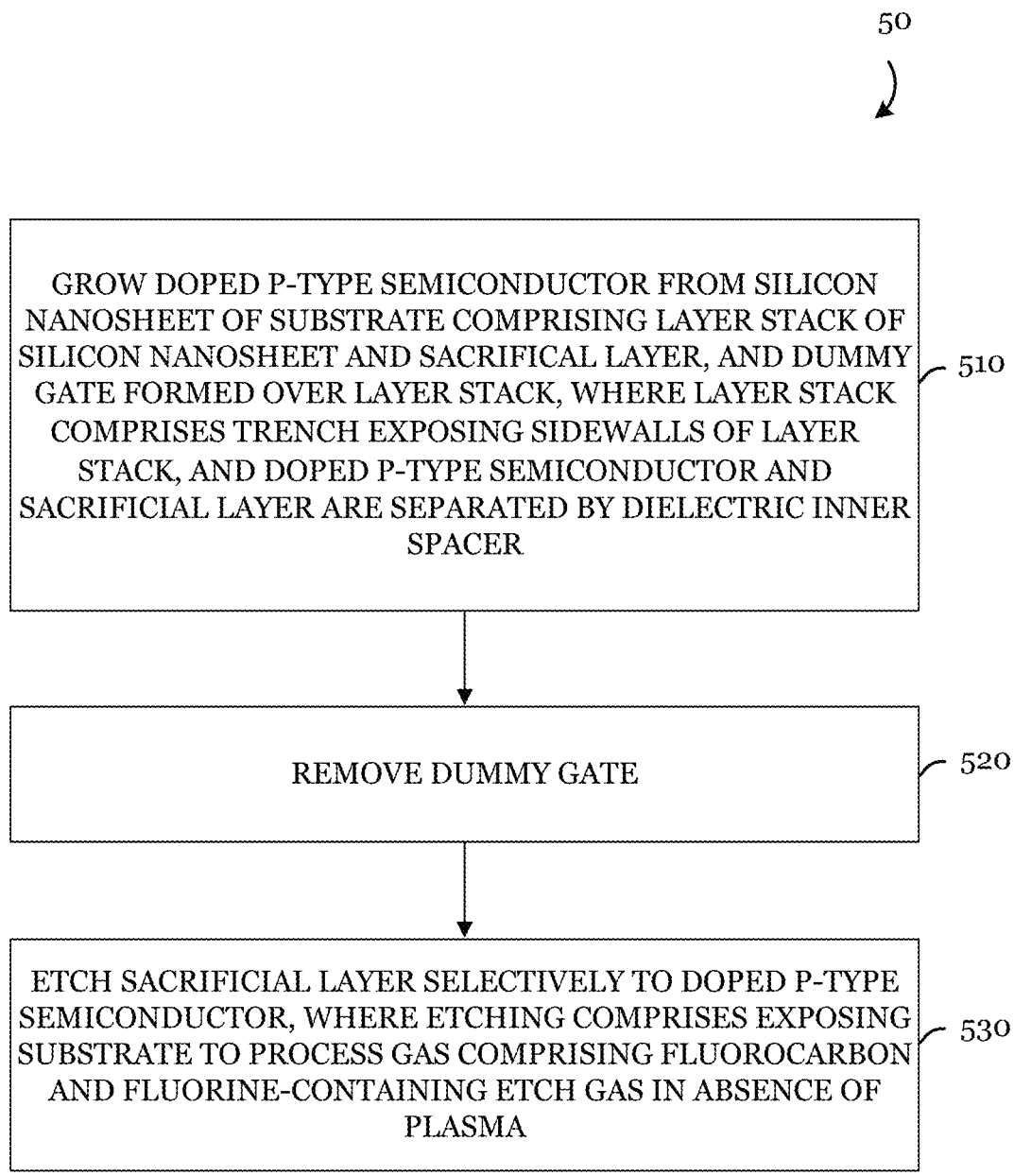
Figure 5B:
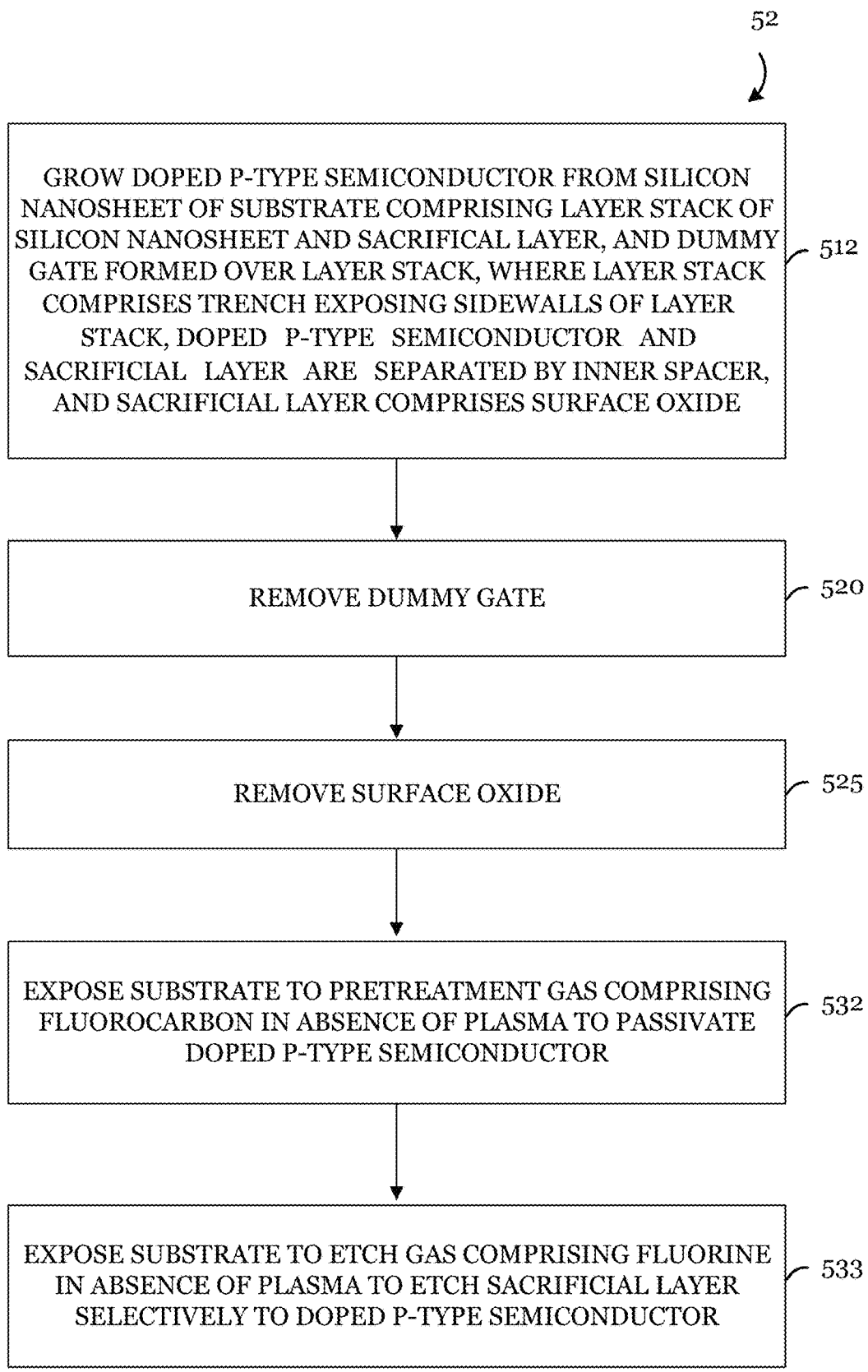
Figure 5C:
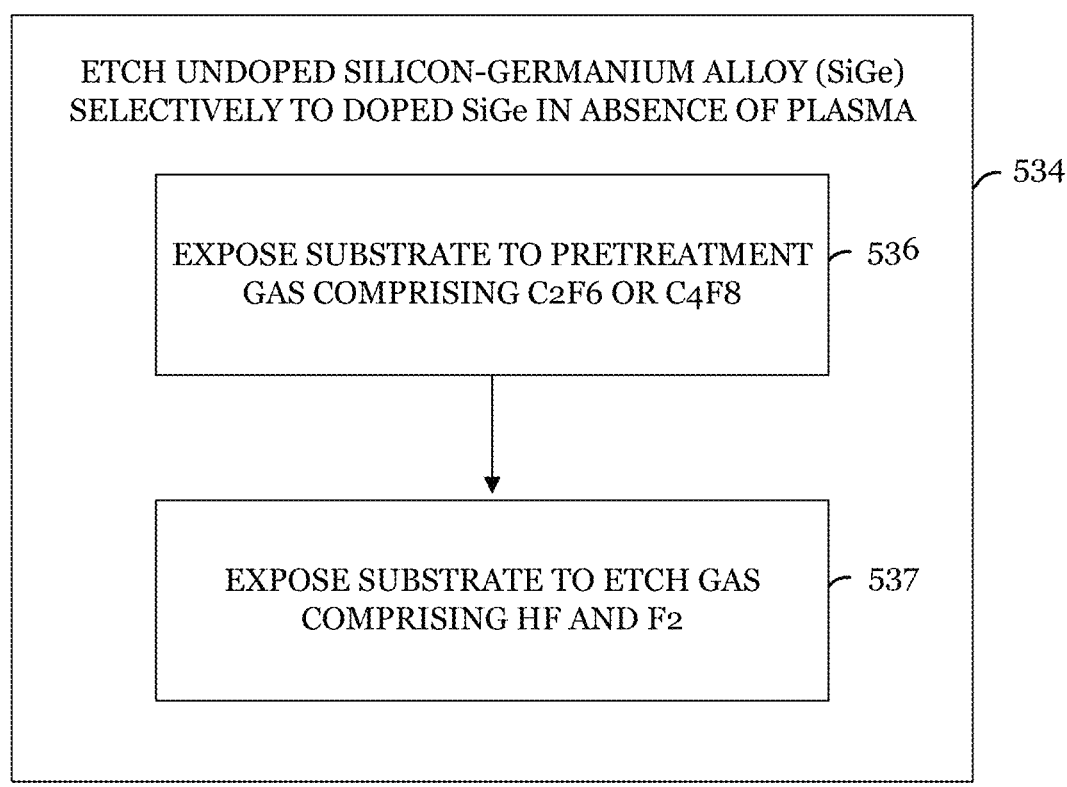

FIG. 4 illustrates the effect of a fluorocarbon pretreatment on the etch rate of un-doped silicon germanium (SiGe) and boron-doped SiGe (B-doped SiGe) during the plasma-less etch in accordance with one embodiment.

The inventors of this application demonstrated through experiments that the fluorocarbon pretreatment can enable the etch selectivity between an un-doped semiconductor and a doped-semiconductor. The plasma-less etch process was tested for two substrates, un-doped SiGe and B-doped SiGe, with and without the fluorocarbon pretreatment with $C_2F_6$. The etch process was performed by exposing the substrate to an etch gas comprising HF, $F_2$, and $ClF_3$ in Ar in the absence of plasma. Three different Ge concentrations in SiGe substrates were examined. As indicated in FIG. 4, without the fluorocarbon pretreatment, SiGe (solid line) and B-doped SiGe (dotted line) exhibit comparable etch rates at any Ge concentration. At a higher Ge concentration, the etch rate for B-doped SiGe is slightly higher. The comparable etch rates or higher etch rate for B-doped SiGe is undesired as described above (e.g., FIGS. 1A-1B). On the other hand, with the fluorocarbon pretreatment, the etch rate for B-doped SiGe (dotted line) is substantially reduced by about approximately 30-40%, while that for un-doped SiGe (solid line) remains almost the same level. This trend was consistent for different Ge concentrations. It should be noted that the Ge concentration may typically be higher in doped SiGe for the S/D material than in undoped SiGe for the sacrificial layer. The trend in FIG. 4 demonstrates that the distinct etch rates can be realized even between a doped SiGe with higher Ge concentration and an undoped SiGe with lower Ge concentration. The results demonstrate the selective suppression of etch for B-doped SiGe, which advantageously enables etch selectivity for the plasma-less etch process applicable in pFET fabrication.

FIGS. 5A-5C illustrate process flow charts of methods of plasma-less etch in accordance with various embodiments. The process flow can be followed with the figures (e.g., FIGS. 2C-2E and 3A-3B) discussed above and hence will not be described again.

In FIG. 5A, a process flow 50 starts with growing a doped p-type semiconductor from a silicon nanosheet of a substrate comprising a layer stack of alternating layers of the silicon nanosheet and a sacrificial layer, and also a dummy gate formed over the layer stack, where the layer stack comprises a trench exposing sidewalls of the layer stack, and where the doped p-type semiconductor and the sacrificial layer are separated by a dielectric inner spacer (block 510, FIG. 2C). Subsequently, the dummy gate may be removed (block 520, FIG. 2D), followed by etching the sacrificial layer selectively to the doped p-type semiconductor (block 530, FIG. 2E). In various embodiments, the etching is a plasma-less process comprising exposing the substrate to a process gas comprising a fluorocarbon and a fluorine-containing etch gas in the absence of plasma.

In FIG. 5B, another process flow 52 starts with growing a doped p-type semiconductor from a silicon nanosheet of a substrate comprising a layer stack of alternating layers of the silicon nanosheet and a sacrificial layer, and also a dummy gate formed over the layer stack, where the layer stack comprises a trench exposing sidewalls of the layer stack, where the doped p-type semiconductor and the sacrificial layer are separated by an inner spacer, and where the sacrificial layer comprises a surface oxide (block 512, FIG. 2C). Subsequently, the dummy gate may be removed (block 520, FIG. 2D), followed by removing the surface oxide (block 525). The substrate may then be exposed to a pretreatment gas comprising a fluorocarbon in the absence of plasma to passivate the doped p-type semiconductor, where a portion of the pretreatment gas penetrating the inner spacer (block 532), followed by exposing the substrate to an etch gas comprising fluorine in the absence of plasma to etch the sacrificial layer selectively to the doped p-type semiconductor (block 533, FIG. 2E).

In FIG. 5C, yet another process flow 54 is for etching un-doped silicon-germanium alloy (SiGe) of the substrate selectively to a doped SiGe of the substrate in the absence of plasma (block 534). The etching process may comprise exposing the substrate to a pretreatment gas comprising $C_2F_6$ or $C_4F_8$ (block 536) and exposing the substrate to an etch gas comprising HF and $F_2$ (block 537).

Example embodiments of the invention are described below. Other embodiments can also be understood from the entirety of the specification as well as the claims filed herein.

Example 1

A method of fabricating a field effect transistor (FET) over a substrate that includes: growing a doped p-type semiconductor from a silicon nanosheet of the substrate, the substrate including a layer stack of alternating layers of the silicon nanosheet and a sacrificial layer, and a dummy gate formed over the layer stack, the layer stack including a trench exposing sidewalls of the layer stack, the doped p-type semiconductor and the sacrificial layer being separated by a dielectric inner spacer; removing the dummy gate; and etching the sacrificial layer selectively to the doped p-type semiconductor, the etching including exposing the substrate to a process gas including a fluorocarbon and a fluorine-containing etch gas in the absence of plasma.

Example 2

The method of example 1, further including, prior to the etching, performing an oxide removal process to remove surface oxide from the sacrificial layer.

Example 3

The method of one of examples 1 or 2, where the oxide removal process including: exposing the substrate to a process gas including HF in the absence of plasma; and heating the substrate to a temperature between 100° C. and 200° C. under an inert gas flow.

Example 4

The method of one of examples 1 to 3, further including, after the etching, heating the substrate to a temperature between 100° C. and 200° C. under an inert gas flow.

Example 5

The method of one of examples 1 to 4, where the fluorocarbon is $C_2F_6$, $C_4F_8$, or a hydrofluorocarbon.

Example 6

The method of one of examples 1 to 5, where the fluorine-containing etch gas includes HF, $F_2$, or $ClF_3$.

Example 7

The method of one of examples 1 to 6, where the doped p-type semiconductor includes boron-doped silicon-germanium alloy (B-doped SiGe).

Example 8

The method of one of examples 1 to 7, where the sacrificial layer includes silicon-germanium alloy (SiGe).

Example 9

The method of one of examples 1 to 8, where the dielectric inner spacer includes SiN, SiCN, SiOCN, or SiOC.

Example 10

The method of one of examples 1 to 9, where the substrate further includes another layer stack, the another layer stack including another silicon nanosheet and another sacrificial layer, the substrate further including a n-type semiconductor grown from the another silicon nanosheet, and where the etching also etching the another sacrificial layer.

Example 11

A method of fabricating a field effect transistor (FET) over a substrate that includes: growing a doped p-type semiconductor from a silicon nanosheet of the substrate, the substrate including a layer stack of alternating layers of the silicon nanosheet and a sacrificial layer, and a dummy gate formed over the layer stack, the layer stack including a trench exposing sidewalls of the layer stack, the doped p-type semiconductor and the sacrificial layer being separated by an inner spacer, the sacrificial layer including a surface oxide; removing the dummy gate; removing the surface oxide; exposing the substrate to a pretreatment gas including a fluorocarbon in the absence of plasma to passivate the doped p-type semiconductor, a portion of the pretreatment gas penetrating the inner spacer; and exposing the substrate to an etch gas including fluorine in the absence of plasma to etch the sacrificial layer selectively to the doped p-type semiconductor.

Example 12

The method of example 11, further including, after the exposing to the etch gas, heating the substrate to a temperature between 100° C. and 200° C. under an inert gas flow.

Example 13

The method of one of examples 11 or 12, where the exposing to the pretreatment gas is performed at a temperature between 0° C. and 50° C., and where the exposing to the etch gas is performed at a temperature between 35° C. and 80° C.

Example 14

The method of one of examples 11 to 13, where the exposing to the etch gas is performed without exposing the substrate to a fluorocarbon.

Example 15

The method of one of examples 11 to 14, where the fluorocarbon is $C_2F_6$, $C_4F_8$, or a hydrofluorocarbon, and where the etch gas includes HF, $F_2$, or $ClF_3$.

Example 16

The method of one of examples 11 to 15, where the doped p-type semiconductor includes boron-doped silicon-germanium alloy (B-doped SiGe), and where the sacrificial layer includes silicon-germanium alloy (SiGe).

Example 17

A method of processing a substrate, the method including: etching un-doped silicon-germanium (SiGe) of the substrate selectively to doped SiGe of the substrate in the absence of plasma, the etching including, exposing the substrate to a pretreatment gas including $C_2F_6$ or $C_4F_8$, and exposing the substrate to an etch gas including HF and $F_2$.

Example 18

The method of example 17, further including, after the etching, fabricating a p-channel field effect transistor (FET) using the doped SiGe of the substrate for a channel of the p-channel FET.

Example 19

The method of one of examples 17 or 18, further including, after the etching, fabricating a stack of a p-channel field effect transistor (FET) and a n-channel FET using the doped SiGe of the substrate for a channel of the p-channel FET, where the etching includes channel release for the p-channel FET and the n-channel FET.

Example 20

The method of one of examples 17 to 19, where the etch gas further include $ClF_3$.

Example 21

The method of one of examples 17 to 20, where the doped SiGe is boron-doped SiGe.

Example 22

The method of one of examples 11 to 16, where the removing of the surface oxide includes exposing the substrate to another etch gas including HF and $NH_3$ in the absence of plasma.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating a field effect transistor (FET) over a substrate, the method comprising:
   growing a doped p-type semiconductor from a silicon nanosheet of the substrate, the substrate comprising a layer stack of alternating layers of the silicon nanosheet and a sacrificial layer, and a dummy gate formed over the layer stack, the layer stack comprising a trench exposing sidewalls of the layer stack, the doped p-type semiconductor and the sacrificial layer being separated by a dielectric inner spacer;
   removing the dummy gate; and
   etching the sacrificial layer selectively to the doped p-type semiconductor, the etching comprising exposing the substrate to a process gas comprising a fluorocarbon and a fluorine-containing etch gas in the absence of plasma.

2. The method of claim 1, further comprising, prior to the etching, performing an oxide removal process to remove surface oxide from the sacrificial layer.

3. The method of claim 2, wherein the oxide removal process comprises:
   exposing the substrate to a process gas comprising HF in the absence of plasma; and
   heating the substrate to a temperature between 100° C. and 200° C. under an inert gas flow.

4. The method of claim 1, further comprising, after the etching, heating the substrate to a temperature between 100° C. and 200° C. under an inert gas flow.

5. The method of claim 1, wherein the fluorocarbon is $C_2F_6$, $C_4F_8$, or a hydrofluorocarbon.

6. The method of claim 1, wherein the fluorine-containing etch gas comprises HF, $F_2$, or $ClF_3$.

7. The method of claim 1, wherein the doped p-type semiconductor comprises boron-doped silicon-germanium alloy (B-doped SiGe).

8. The method of claim 1, wherein the sacrificial layer comprises silicon-germanium alloy (SiGe).

9. The method of claim 1, wherein the dielectric inner spacer comprises SiN, SiCN, SiOCN, or SiOC.

10. The method of claim 1, wherein the substrate further comprises another layer stack, the another layer stack comprising another silicon nanosheet and another sacrificial layer, the substrate further comprising a n-type semiconductor grown from the another silicon nanosheet, and wherein the etching also etching the another sacrificial layer.

11. A method of fabricating a field effect transistor (FET) over a substrate, the method comprising:
    growing a doped p-type semiconductor from a silicon nanosheet of the substrate, the substrate comprising a layer stack of alternating layers of the silicon nanosheet and a sacrificial layer, and a dummy gate formed over the layer stack, the layer stack comprising a trench exposing sidewalls of the layer stack, the doped p-type semiconductor and the sacrificial layer being separated by an inner spacer, the sacrificial layer comprising a surface oxide;

removing the dummy gate;

removing the surface oxide;

exposing the substrate to a pretreatment gas comprising a fluorocarbon in the absence of plasma to passivate the doped p-type semiconductor, a portion of the pretreatment gas penetrating the inner spacer; and exposing the substrate to an etch gas comprising fluorine in the absence of plasma to etch the sacrificial layer selectively to the doped p-type semiconductor.

12. The method of claim 11, further comprising, after the exposing to the etch gas, heating the substrate to a temperature between 100° C. and 200° C. under an inert gas flow.

13. The method of claim 11, wherein the exposing to the pretreatment gas is performed at a temperature between 0° C. and 50° C., and wherein the exposing to the etch gas is performed at a temperature between 35° C. and 80° C.

14. The method of claim 11, wherein the exposing to the etch gas is performed without exposing the substrate to a fluorocarbon.

15. The method of claim 11, wherein the fluorocarbon is $C_2F_6$, $C_4F_8$, or a hydrofluorocarbon, and wherein the etch gas comprises HF, $F_2$, or $ClF_3$.

16. The method of claim 11, wherein the doped p-type semiconductor comprises boron-doped silicon-germanium alloy (B-doped SiGe), and wherein the sacrificial layer comprises silicon-germanium alloy (SiGe).

17. A method of processing a substrate, the method comprising:

etching un-doped silicon-germanium (SiGe) of the substrate selectively to doped SiGe of the substrate in the absence of plasma, the etching comprising, exposing the substrate to a pretreatment gas comprising $C_2F_6$ or $C_4F_8$, and exposing the substrate to an etch gas comprising HF and $F_2$.

18. The method of claim 17, further comprising, after the etching, fabricating a p-channel field effect transistor (FET) using the doped SiGe of the substrate for a channel of the p-channel FET.

19. The method of claim 17, further comprising, after the etching, fabricating a stack of a p-channel field effect transistor (FET) and a n-channel FET using the doped SiGe of the substrate for a channel of the p-channel FET, wherein the etching comprises channel release for the p-channel FET and the n-channel FET.

20. The method of claim 17, wherein the etch gas further comprises $ClF_3$.

* * * * *